(12) United States Patent
Zhu

(10) Patent No.: US 9,064,849 B2
(45) Date of Patent: Jun. 23, 2015

(54) 3D INTEGRATED CIRCUIT STRUCTURE, SEMICONDUCTOR DEVICE AND METHOD OF MANUFACTURING SAME

(75) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 1045 days.

(21) Appl. No.: 13/062,001

(22) PCT Filed: Jun. 22, 2010

(86) PCT No.: PCT/CN2010/074212
§ 371 (c)(1),
(2), (4) Date: Mar. 3, 2011

(87) PCT Pub. No.: WO2011/066742
PCT Pub. Date: Jun. 9, 2011

(65) Prior Publication Data
US 2011/0227158 A1    Sep. 22, 2011

(30) Foreign Application Priority Data
Dec. 4, 2009    (CN) .......................... 2009 1 0242101

(51) Int. Cl.
*H01L 21/4763*    (2006.01)
*H01L 23/48*    (2006.01)
*H01L 25/065*    (2006.01)
*H01L 25/00*    (2006.01)

(52) U.S. Cl.
CPC .......... *H01L 23/481* (2013.01); *H01L 25/0657* (2013.01); *H01L 25/50* (2013.01); *H01L 2225/06513* (2013.01); *H01L 2225/06541* (2013.01); *H01L 2924/0002* (2013.01)

(58) Field of Classification Search
CPC ........... H01L 2224/32221; H01L 2224/32225; H01L 2224/73204; H01L 2924/00; H01L 2924/10253
USPC ...................... 257/621, 774, 686, 347, E21.09
See application file for complete search history.

(56) References Cited

U.S. PATENT DOCUMENTS 7,825,024 B2 * 11/2010 Lin et al. ...................... 257/774
7,910,473 B2 *  3/2011 Chen ............................ 438/619

* cited by examiner

*Primary Examiner* — Cuong Q Nguyen
(74) *Attorney, Agent, or Firm* — Troutman Sanders LLP

(57) ABSTRACT

The present invention discloses a semiconductor device. In one embodiment, the semiconductor device comprises a substrate, a diffusion stop layer formed on the substrate, an SOI layer formed on the diffusion stop layer, an MOSFET transistor formed on the SOI layer, and a TSV formed in a manner of penetrating through the substrate, the diffusion stop layer, the SOI layer, and a layer where the MOSFET transistor is located; and an interconnect structure connecting the MOSFET transistor and the TSV.

16 Claims, 8 Drawing Sheets

3D INTEGRATED CIRCUIT STRUCTURE, SEMICONDUCTOR DEVICE AND METHOD OF MANUFACTURING SAME

FIELD OF THE INVENTION

The present invention relates to the field of semiconductor manufacturing, and in particular, to a three-dimension (3D) integrated circuit structure and a method of manufacturing the same.

BACKGROUND OF THE INVENTION

Conventional devices will be scaled down to its physical limitations in 10-15 years. However, during this period, new device structures, for example carbon nanotubes (CNT), spintronic devices and molecular switches, etc, may not be developed to a level of practical application. Therefore, in such a case where copper and low k dielectric materials are used for integration, new methods for device-level and system-level assembly are sought for industrial applications, so as to meet recent demands. Three-dimension (3D) integrated circuits (ICs) are the most advanced technique, which may shorten the length of interconnects, thereby improving speed of circuits, reducing power consumption, and increasing system storage bandwidth.

The current 3D IC integration is described as a system-level architecture formed by combination of a plurality of wafers, wherein each wafer is a stack of a plurality of planar device layers interconnected in a Z direction by though-silica-vias (TSVs). With the application of 3D ICs, the size of TSVs will be scaled continuously, the thickness of silicon layer will also be thinned, and the 3D integration circuits will be more widely used.

However, in some processes of forming a 3D integrated circuit structure, for example in a process of forming a TSV, metal materials such as copper, aluminum, and tungsten, etc., will be filled into the TSV. Besides, in a process of grinding the bottom of a wafer to expose the metal material in the TSV so as to be bonded with other wafers, the metal material or other dopants, for example metal ions such as iron and sodium, etc, exposed at the bottom of the TSV, will be diffused into the metal oxide semiconductor field effect transistor (MOSFET) in the wafer because of the grinding process. Further, in the following process of inter-bonding of wafers, the above variety of metal ions are rapidly diffused into the MOSFET due to the bonding high temperature. Thus, failures will occur to the formed MOSFET.

SUMMARY OF THE INVENTION

An objective of the present invention is to solve at least one of the above problems in the prior art.

Therefore, according to an embodiment of the present invention, there is provided a 3D integrated circuit structure, a semiconductor device, and a method of manufacturing thereof, so as to enhance the performance of 3D integrated circuit.

According to an aspect of the present invention, an embodiment of the present invention provides a 3D integrated circuit structure, comprising: a first wafer, comprising: a substrate; a diffusion stop layer formed on the substrate; a silicon-on-insulator (SOI) layer formed on the diffusion stop layer; a metal oxide semiconductor field effect transistor (MOSFET) formed on the SOI layer; a through-silicon-via (TSV) formed in a manner of penetrating through the substrate, the stop diffusion layer, the SOI layer and a layer where the MOSFET transistor is located; and a first interconnect structure for connecting the MOSFET transistor and the TSV; wherein the bottom of the first wafer is ground to expose the TSV filled with a metal material, and the bottom of the first wafer is connected to external circuits or a second interconnect structure of a second wafer by means of the TSV According to another aspect of the present invention, an embodiment of the present invention provides a method of forming a 3D integrated circuit, comprising the following steps: forming a first wafer, wherein forming the first wafer comprises: forming a first wafer, wherein forming the first wafer comprises: forming a substrate; forming a diffusion stop layer on the substrate; forming an SOI layer on the diffusion stop layer; forming an MOSFET transistor on the SOI layer; forming a TSV in a manner of penetrating through the substrate, the stop diffusion layer, the SOI layer and a layer where the MOSFET transistor is located; and forming an interconnect structure for connecting the MOSFET transistor and the TSV; grinding the bottom of the first wafer to expose the TSV filled with a metal material; and connecting the bottom of the first wafer to external circuits or an interconnect structure of a second wafer by means of the TSV.

According to a further aspect of the present invention, an embodiment of the present invention provides a semiconductor device, comprising: a substrate; a diffusion stop layer formed on the substrate; an SOI layer formed on the diffusion stop layer; an MOSFET transistor formed on the SOI layer; a TSV formed in a manner of penetrating through the substrate, the stop diffusion layer, the SOI layer and a layer where the MOSFET transistor is located; and an interconnect structure for connecting the MOSFET transistor and the TSV.

In the present invention, for an MOSFET device constructed on the SOI layer, by setting a diffusion stop layer beneath the SOI layer, metal materials filled in the TSV or ions of other metal dopants in a wafer may be prevented from being diffused into the MOSFET transistor in the grinding of the wafer and the subsequent wafer bonding process, thereby providing an MOSFET device with a better performance and a 3D integrated circuit constructed of the same.

Additional aspects and advantages of the present invention will be partially provided in the following description, and will become partially apparent from the following description or understood through implementation of the present invention.

BRIEF DESCRIPTION OF THE DRAWINGS

The above and/or other additional aspects and advantages of the present invention will become apparent and readily understood from the following description of the embodiments with reference to the drawings, wherein.

DETAILED DESCRIPTION OF THE PREFERRED EMBODIMENTS

Figure 1A:
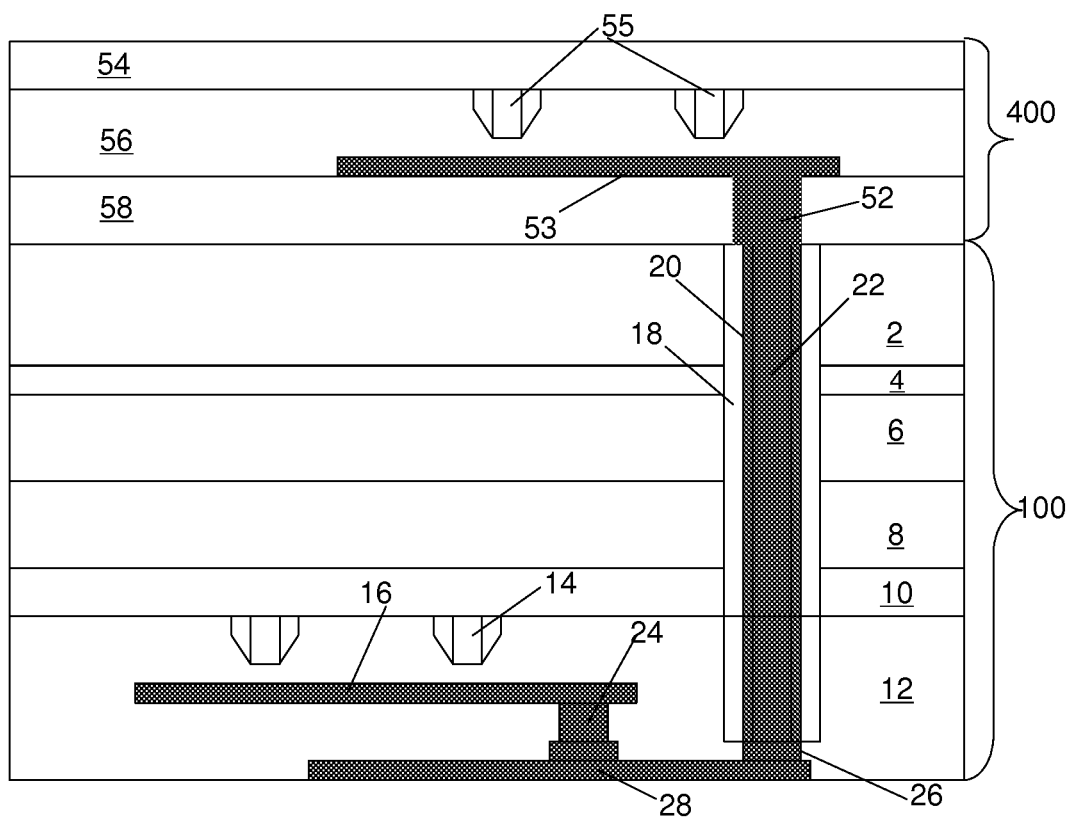
FIGS. 1a-1e are diagrams of sectional structures of different phases for a process of manufacturing a wafer device for a 3D integrated circuit according to an embodiment of the present invention.

Hereinafter, the embodiments of the present invention will be described in detail. Examples of the embodiments are illustrated in the drawings, across which the same or like reference numbers indicate the same or like elements or elements with the same or like functions. The embodiments described hereinafter with reference to the drawings are exemplary and only for explaining the present invention, which should not be interpreted as limitations to the present invention.

The following disclosure provides a plurality of different embodiments or examples to achieve different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following arrangement in which a first object is "on" a second object may include an embodiment in which the first object and the second object are formed to be in direct contact with each other, and may also include an embodiment in which another object is formed between the first object and the second object such that the first and second objects might not be in direct contact with each other.

Referring to FIGS. 1a to 1e, these diagrams show sectional structures of different phases in a process of manufacturing a wafer for a 3D integrated circuit according to an embodiment of the present invention.

As shown in FIG. 1a, the wafer device comprises a substrate 2. In an embodiment of the present invention, the substrate 2 may comprise any semiconductor substrate material, specifically, but not limited to, a bulk wafer. The wafer device further comprises a first oxide layer 4 formed on the substrate 2. The first oxide layer 4 may be a relatively thin oxide layer formed on the substrate 2 through a deposition process known in the art, with a thickness of 5-10 nm. The purpose for setting the first oxide layer 4 is to improve the contact performance of the substrate 2 and the subsequently formed diffusion stop layer 6. Of course, the present invention is not limited to this embodiment. For example, in an embodiment, this wafer device may not comprise a first oxide layer 4. Instead, a diffusion stop layer 6 for preventing the diffusion of metal ions is deposited on the first oxide layer 4.

In an embodiment, the diffusion stop layer 6 is a nitride layer. The nitride has good compactness and thus may better prevent diffusion of metal ions. The nitride includes, but not limited to, $Si_3N_4$ or SiCN. It may be insufficient for a too thin nitride deposited to preventing diffusion of metal ions. However, a too thick nitride may generate too large capacitance. In an embodiment, the thickness of the deposited nitride may be in the range between 5-100 nm.

A second oxide layer 8 may be further deposited on the diffusion stop layer 6. The second oxide layer 8 may a relatively thick oxide layer, with a thickness of 5-200 nm. The purpose for setting the second oxide layer 8 is to reduce capacitance. Through the above steps, the wafer structure as shown in FIG. 1a is obtained. Of course, the present invention is not limited to this embodiment, For example, in an embodiment, this wafer device may not comprise the second oxide layer 8.

Figure 1B:
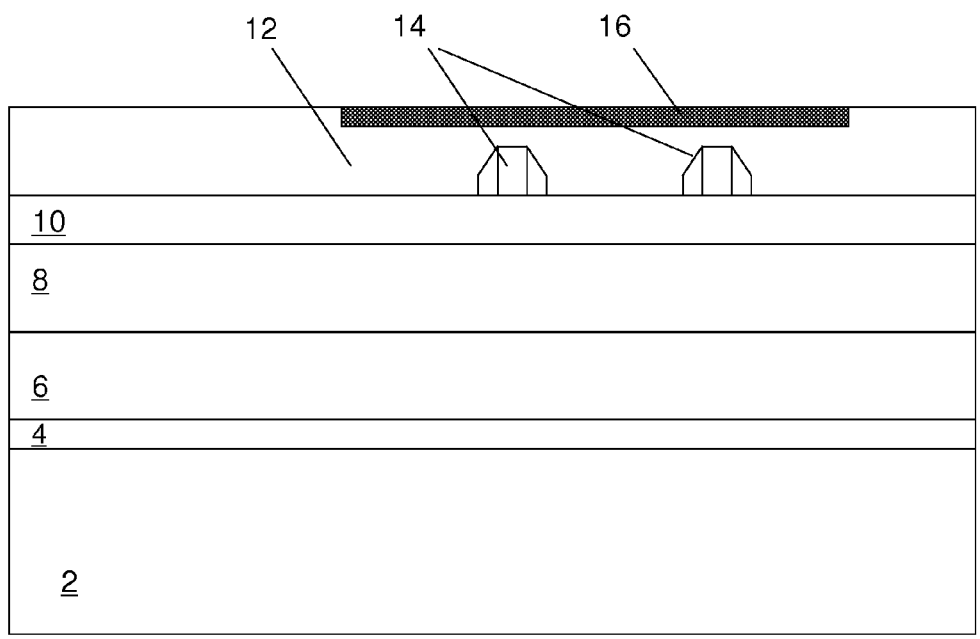

As shown in FIG. 1b, a silicon-on-insulator (SOI) layer 10 is formed on the wafer structure formed in FIG. 1a. The SOI layer 10 may be bonded with the second oxide layer 8 by the method of for example smart-cut, thereby providing the SOI layer 10 on the top of the wafer structure. Then, a metal oxide semiconductor field effect transistor (MOSFET) 14 and its back end of line (BEOL) 16 are constructed on the SOI layer 10. The BEOL structure 16 may be a copper interconnect formed by a metal wiring process. The MOSFET transistor 14 and its BEOL structure 16 are formed in the oxide layer 12 deposited on the SOI layer 10. Here, the construction of the MOSFET transistor 14 and its BEOL structure 16 may utilize any applicable method known in the art.

Figure 1C:
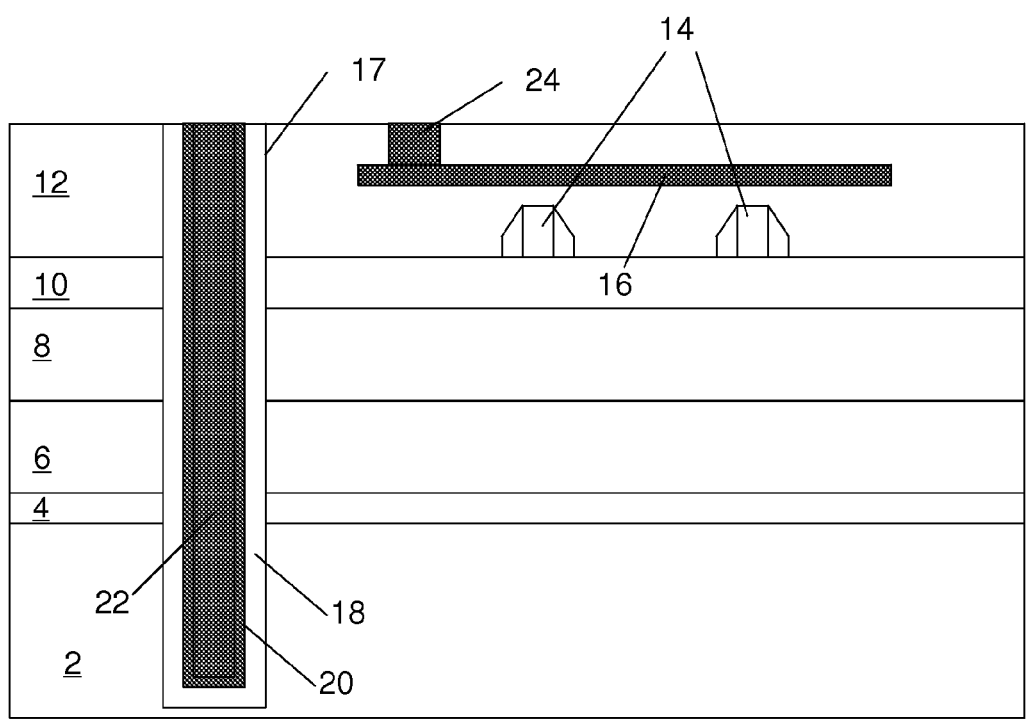

FIG. 1c shows a diagram of the sectional structure for the formation of a through-silicon-via (TSV) in the semiconductor structure as shown in FIG. 1b. Steps of forming the TSV comprising: a via 17 is formed penetrating through the substrate 2, the first oxide layer 4, the diffusion stop layer 6, the second oxide layer 8, the SOI layer 10, and the oxide layer 12 where the MOSFET transistor 14 is located. The via 17 may be formed by dry etching, for example reactive ion plasma etching, etc. Then, an isolating layer 18 may be formed on the sidewalls of the via 17, for example, by depositing insolating materials such as an oxide or Si3N4 in the via 17. Next, a buried layer 20 may be deposited on the sidewalls of the isolating layer 18. The buried layer 20 may prevent the conductive metal material filled in the via 17 from migrating outwards to enter into the semiconductor device to thereby degrade the performance of the MOSFET transistor 14 in the subsequent processes. In an embodiment, the materials for the buried layer 20 may be selected from a group of Ru, Ta, TaN, Ti, TiN, TaSiN, TiSiN, TiW, WN and any combination thereof.

Finally, a conductive material 22 for example, metals like Copper (Cu), aluminum (Al), or tungsten (W), or a conductive polymer, metallic silicide, etc, is filled in the via 17, thereby forming the TSV for interconnecting of the 3D integrated circuit wafers. In an embodiment of the present invention, the conductive material 22 is a metal material. Then, planarization and chemical-mechanical polishing (CMP) are performed to the metal material deposited in the via 17, thereby forming the TSV. The TSV may be formed by any appropriate processing method in the prior art, and detailed description thereof is omitted here.

Figure 1D:
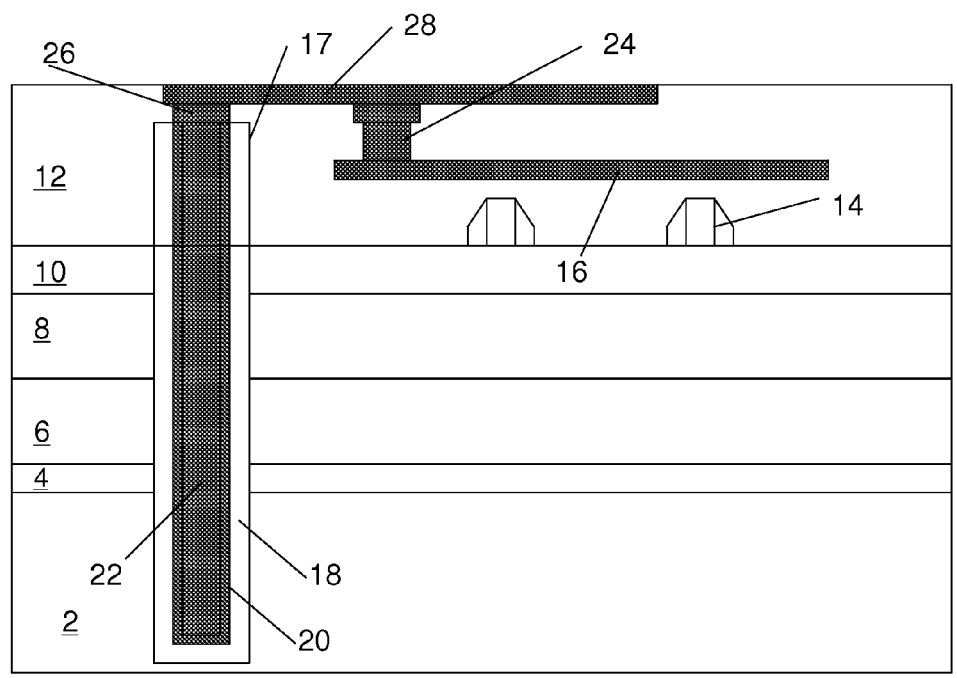

FIG. 1d shows a structural diagram of an interconnect structure connecting the MOSFET transistor 14 and the TSV, wherein the interconnect structure comprises a via 26 formed above the TSV and communicated with the TSV, a via 24 formed above a BEOL structure 16 corresponding to the MOSFET transistor 14, and a metal interconnect line 28 connecting the via 24 and the via 26. Thus, the TSV may be connected to the MOSFET transistor 14 by the above interconnect structure. Therefore, 3D integrated circuit structures may be implemented by further connecting the interconnect structure of this wafer with the corresponding interconnect structure of other wafers for multiple-wafer connection.

In order to connect the wafer device having the structure of FIG. 1d with other wafers, so as to form a 3D integrated circuit, supply power to the formed 3D integrated circuit, or perform input/output (I/O) of the external signals, the TVS at the bottom of the corresponding wafer is required to be grinded or thinned, to expose the metal material in the TSV for corresponding conductive connection.

Figure 1E:
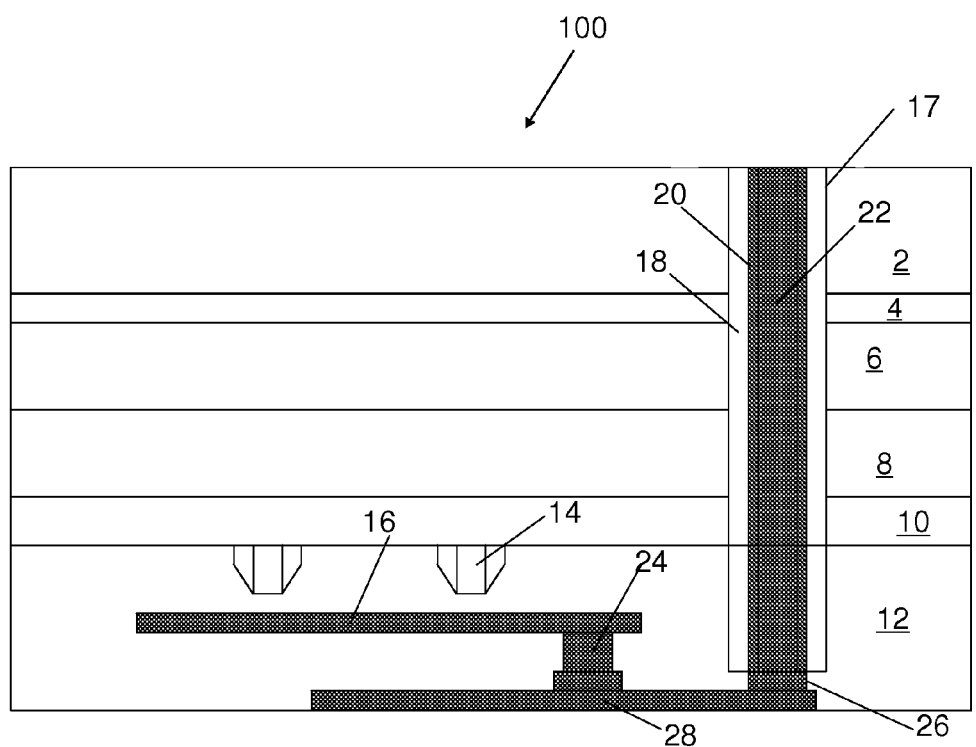

As shown in FIG. 1e, it is necessary to turn the wafer device over to perform a grinding or thinning processing to its bottom, so as to expose the metal material 22 in the TSV at the bottom of the wafer. Thus, the exposed metal ions will be diffused into the wafer from the bottom in this grinding process. By means of the diffusion stop layer 6 of the present invention, the metal ions is blocked from entering into the SOI layer 10 and further into the MOSFET transistor 14 thereabove. Thus, the reliability of the MOSFET transistor 14 may be enhanced.

Through the above steps, the wafer device 100 for 3D integrated circuits as shown in FIG. 1e is obtained.

Figure 2:
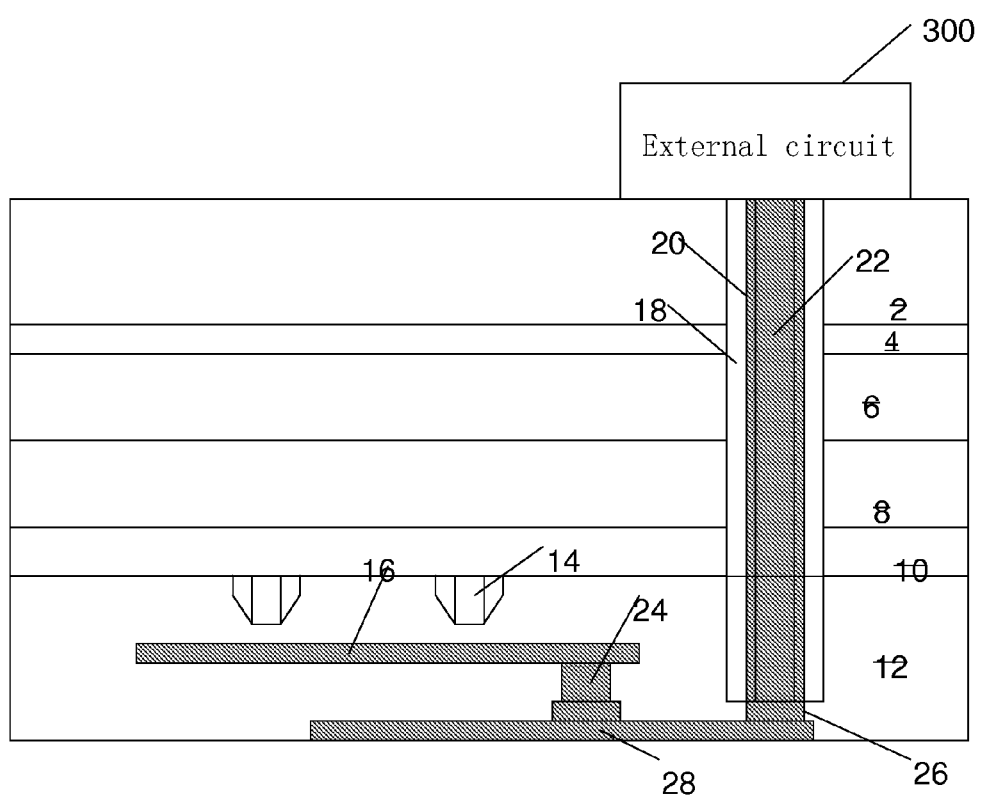
FIGS. 2 and 3 are diagrams of partial structures of a 3D integrated circuit of a first embodiment formed by using the wafer device of the embodiment of FIG. 1.
Figure 3:
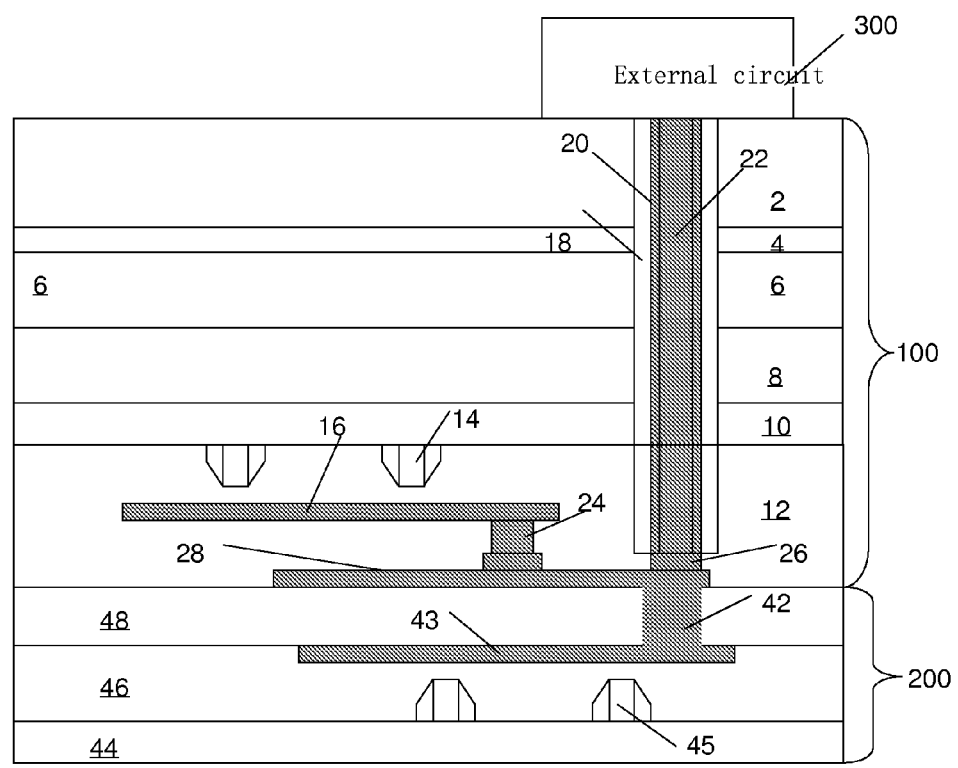

FIGS. 2 and 3 illustrate partial structures of a 3D integrated circuit of a first embodiment formed by using the wafer device 100 of the embodiment of FIG. 1.

In FIG. 2, a diagram of the connection of the formed wafer device 100 for the 3D integrated circuit to an external circuit 300 is shown. Here, the external circuit 300 may be an external power source or external signal I/O. As shown in FIG. 2, a conductive material 22 exposed from the wafer device 100 is connected to the external circuit 300, thereby supplying power to the 3D integrated circuit or performing external signal transmission.

In FIG. 3, besides the connection of the wafer device 100 for the 3D integrated circuit to the external circuit 300, a diagram of the connection for the wafer device 100 to another wafer device 200 of the 3D integrated circuit is also provided. As shown in FIG. 3, the wafer device 200 is turned over, with a via 42 being provided thereon, the via 42 being connected to a BEOL 43 of a MOSFET transistor 45 constructed on the wafer device 200. The MOSFET transistor 45, the BEOL 43, and the via 42 of the wafer device 200 are constructed in the same manner as that of the wafer device 100, i.e., the MOSFET transistor 45 is disposed in an oxide layer 46 above the SOI layer 44, and the via 42 is disposed in the oxide layer 48 above the oxide layer 46.

Thus, the wafer 100 is connected to the via 42 through its interconnect structure (i.e., the vias 24, 26 and the metal interconnect line 28), such that the TSV of the wafer device 100 is connected to the wafer device 200, i.e., connecting the wafer device 100 and the wafer device 200 in a top-to-bottom manner, thereby implementing a multiplewafer stacking structure of the 3D integrated circuit.

In an embodiment, the wafer device 200 may have the same semiconductor structure arrangement as the wafer device 100. Thus, when the bottom of the wafer device 200 is bonded with other wafers for forming the 3D integrated circuit, the metal ions exposed from the TSV at the bottom may also be prevented from being diffused into its MOSFET device 45 by means of the diffusion stop layer arranged inside. The diffusion stop layer may prevent diffusion of the metal ions into the MOSFET device 45 more effectively especially in the high-temperature bonding process.

Figure 4:
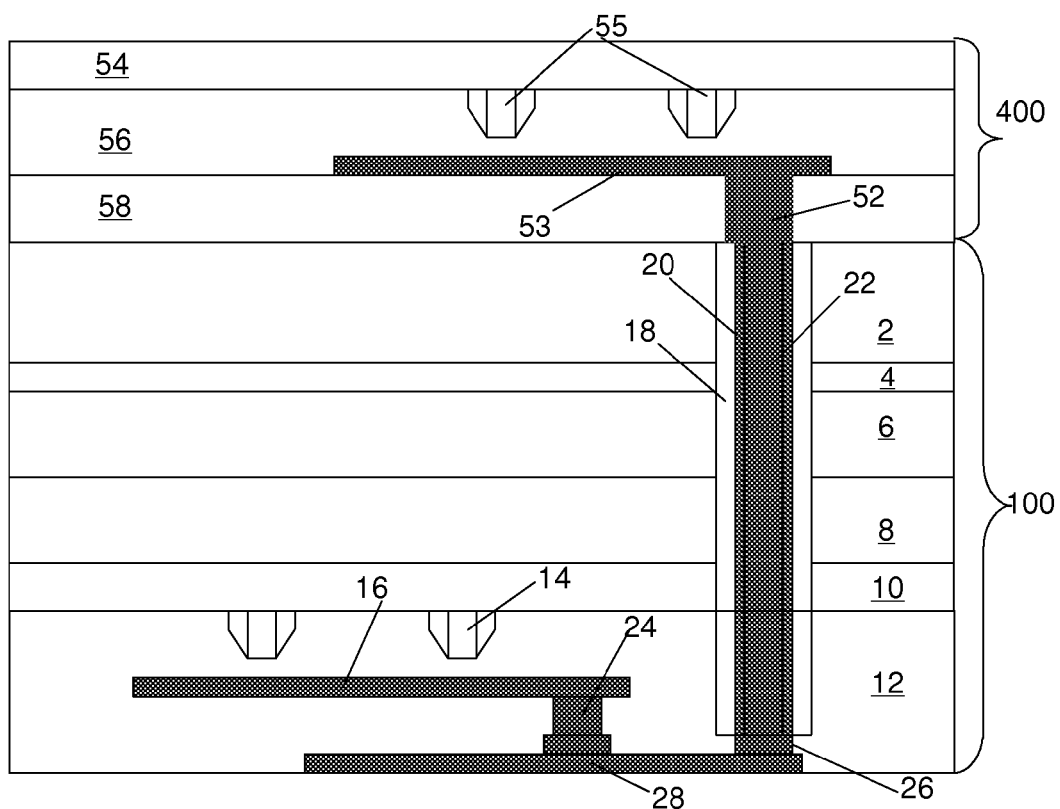
FIG. 4 is a diagram of a partial structure of a 3D integrated circuit of a second embodiment formed by using the wafer device of the embodiment of FIG. 1.

FIG. 4 is a diagram of a partial structure of a 3D integrated circuit of a second embodiment formed by using the wafer device 100 of the embodiment of FIG. 1.

In FIG. 4, the connection of the wafer device 100 for the 3D integrated circuit to another wafer device 400 is provided. As shown in FIG. 4, the wafer device 400 is turned over, with a via 52 being provided thereon, the via 52 being connected to a BEOL 53 of a MOSFET transistor 55 constructed on the wafer device 400. The MOSFET transistor 55, the BEOL 53, and the via 52 of the wafer device 400 are constructed in the same manner as those of the wafer device 100, i.e., the MOSFET transistor 55 is disposed in an oxide layer 56 above the SOI layer 54, and the via 52 is disposed in the oxide layer 58 above the oxide layer 56.

Thus, the wafer 100 is connected to the via 52 through the metal conductive material exposed from its TSV, such that the TSV of the wafer device 100 is connected to the wafer device 200, i.e., connecting the wafer device 100 and the wafer device 400 in a bottom-to-top manner, thereby implementing a multiple-wafer stacking structure of the 3D integrated circuit. The diffusion stop layer may prevent diffusion of the metal ions to the MOSFET device 14 more effectively especially in a high-temperature bonding process.

In an embodiment, the wafer device 400 may have the same semiconductor structure arrangement as the wafer device 100. Thus, when the bottom of the wafer device 400 is further bonded with other wafers for forming the 3D integrated circuit or an external circuit, the metal ions exposed from the corresponding bottom TSV may be prevented from being diffused into its MOSFET device 14 by means of a diffusion stop layer arranged inside.

In the present invention, for an MOSFET device constructed on the SOI layer, by setting a diffusion stop layer, metal materials filled in the TSV, such as Cu, Al, W, etc, or other metal dopants in a wafer, for example ions of Fe, Na, etc., may be prevented from being diffused into the MOSFET transistor in the grinding of the wafer and the subsequent wafer bonding process, thereby providing an MOSFET device with a better performance and a 3D integrated circuit constructed of the same.

Though embodiments of the present invention have been illustrated and described, to a person of normal skill in the art, it may be understood that various variations, modifications, alternations and transformations may be conducted to these embodiments without departing from the principle and spirit of the present invention, and the scope of the present invention is defined by the appending claims and their equivalents.

What is claimed is:

1. A three-dimension integrated circuit structure, characterized in that the integrated circuit structure comprises:
    a first wafer, comprising:
        a substrate defining a contact surface of the first wafer;
        a layer having a metal oxide semiconductor field effect transistor (MOSFET) formed therein;
        a diffusion stop layer disposed between the substrate and the layer having the MOSFET transistor;
        a silicon-on-insulator (SOI) layer formed on the diffusion stop layer;
        a through-silicon-via (TSV) formed in a manner of penetrating through the substrate, the diffusion stop layer, the SOI layer and at least partially penetrating through the layer having the MOSFET transistor; and
        a first interconnect structure for connecting the MOSFET transistor and the TSV;
    wherein a metal material filled in the TSV is exposed at the contact surface of the first wafer, the TSV further comprises a buried layer positioned between the surface of the TSV and the metal material, and the contact surface of the first wafer is connected to external circuits or a second interconnect structure of a second wafer by means of the TSV.

2. The integrated circuit structure according to claim 1, characterized in that the diffusion stop layer is formed of nitride.

3. The integrated circuit structure according to claim 2, characterized in that the nitride comprises Si3N4 or SiCN.

4. The integrated circuit structure according to claim 1, characterized in that the first wafer further comprises a first oxide layer formed between the substrate and the diffusion stop layer.

5. The integrated circuit structure according to claim 1, characterized in that the first wafer further comprises a second oxide layer formed between the diffusion stop layer and the SOI layer.

6. The integrated circuit structure according to claim 1, characterized in that the buried layer comprises at least a material selected from a group comprising Ru, Ta, TaN, Ti, TiN, TaSiN, TiSiN, TiW and WN.

7. A semiconductor device, characterized in that the semiconductor device comprises:
- a substrate defining a contact surface of the semiconductor device;
- a layer having a metal oxide semiconductor field effect transistor (MOSFET) formed therein;
- a diffusion stop layer formed between the substrate and the layer having the MOSFET transistor;
- an SOI layer formed on the diffusion stop layer;
- a TSV formed in a manner of penetrating through the substrate, the diffusion stop layer, the SOI layer and at least partially penetrating through the layer having the MOSFET transistor; and
- an interconnect structure for connecting the MOSFET transistor and the TSV;
- wherein a metal material filled in the TSV is exposed at the contact surface of the semiconductor device, the TSV further comprises a buried layer positioned between the surface of the TSV and the metal material.

8. The semiconductor device according to claim 7, characterized in that the diffusion stop layer is formed of nitride.

9. The semiconductor device according to claim 8, characterized in that the nitride comprises Si3N4 or SiCN.

10. The semiconductor device according to claim 7, characterized by further comprising a first oxide layer formed between the substrate and the diffusion stop layer.

11. The semiconductor device according to claim 7, characterized by further comprising a second oxide layer formed between the diffusion stop layer and the SOI layer.

12. The integrated circuit structure according to claim 1, wherein the layer having the MOSFET transistor defines another contact surface of the first wafer.

13. The integrated circuit structure according to claim 1, wherein the first interconnect structure is formed in the layer having the MOSFET transistor.

14. The integrated circuit structure according to claim 13, wherein the first interconnect structure is configured to connect the first wafer to another wafer.

15. The semiconductor device according to claim 7, wherein the layer having the MOSFET transistor defines another contact surface of the semiconductor device.

16. The semiconductor device according to claim 7, wherein the interconnect structure is formed in the layer having the MOSFET transistor.

* * * * *